United States Patent
Cabrera et al.

(10) Patent No.: US 8,581,662 B2
(45) Date of Patent: Nov. 12, 2013

(54) AMPLIFYING SYSTEM

(75) Inventors: George Cabrera, Mason, OH (US); Dmitri Borodulin, South Lebanon, OH (US)

(73) Assignee: Harris Corporation, Melbourne, FL (US)

( * ) Notice: Subject to any disclaimer, the term of this patent is extended or adjusted under 35 U.S.C. 154(b) by 93 days.

(21) Appl. No.: 13/246,121

(22) Filed: Sep. 27, 2011

(65) Prior Publication Data

US 2013/0076435 A1    Mar. 28, 2013

(51) Int. Cl.
  *H03F 3/68* (2006.01)
(52) U.S. Cl.
  USPC ..................................... 330/124 R
(58) Field of Classification Search
  USPC ............................ 330/124 R, 295
  See application file for complete search history.

(56) References Cited

U.S. PATENT DOCUMENTS

| | | | |
|---|---|---|---|
| 6,374,092 B1 * | 4/2002 | Leizerovich et al. | 455/127.4 |
| 7,262,656 B2 * | 8/2007 | Shiikuma | 330/124 R |
| 7,541,868 B2 | 6/2009 | Bingham | |
| 2011/0140786 A1 | 6/2011 | Blednov | |
| 2011/0193624 A1 | 8/2011 | Scott et al. | |

\* cited by examiner

*Primary Examiner* — Robert Pascal
*Assistant Examiner* — Khiem Nguyen
(74) *Attorney, Agent, or Firm* — Tarolli, Sundheim, Covell & Tummino LLP

(57) ABSTRACT

A system for amplifying an input signal can comprise a main amplifier to amplify a delayed version of the input signal. The system can also comprise a peak amplifier to amplify the input signal upon the input signal reaching a threshold level and disable amplification upon the input signal falling below the threshold level. The system can further comprise a voltage combiner to electromagnetically couple the output of the main amplifier and the peak amplifier, such that an output impedance at an output node of the voltage combiner is a high impedance if the input signal is below the threshold level.

20 Claims, 4 Drawing Sheets

AMPLIFYING SYSTEM

TECHNICAL FIELD

This invention relates to an amplifying system. More particularly, this invention relates to a system for amplifying an input signal.

BACKGROUND

An electronic amplifier is a device for increasing the power of a signal. An electronic amplifier increases the power of a signal by taking energy from a power supply and controlling the output to match the input signal shape but with a larger amplitude. In this sense, an amplifier may be considered as modulating the output of the power supply. Amplifiers can be specified according to their input and output properties. Amplifiers can have some kind of gain, or multiplication factor relating the magnitude of the output signal relative to the input signal. The gain may be specified as the ratio of output voltage to input voltage (voltage gain), output power to input power (power gain), or some combination of current, voltage and power. The power gain of an amplifier depends on the source and load impedances used as well as its voltage gain; while an RF amplifier may have its impedances optimized for power transfer, audio and instrumentation amplifiers are normally employed with amplifier input and output impedances optimized for least loading and highest quality.

Different amplifier designs can be referred to as a class of amplifier. In a class A amplifier, an input signal is amplified over the input signal's entire cycle. Class A amplifiers are relatively inefficient, and can have an efficiency lower than 50%. In a class B amplifier, an input signal is amplified over half the input signals entire cycle. A class B amplifier is relatively efficient up to about 78.5% efficient, adds a relatively large amount of distortion. Class-C amplifiers can conduct less than 50% of the input signal and the distortion at the output is high, but high efficiencies (up to about 90%) are possible.

SUMMARY OF THE INVENTION

One aspect of the invention relates to a system for amplifying an input signal. The system can comprise a main amplifier to amplify a delayed version of the input signal. The system can also comprise a peak amplifier to amplify the input signal upon the input signal reaching a threshold level and disable amplification upon the input signal falling below the threshold level. The system can further comprise a voltage combiner to electromagnetically couple the output of the main amplifier and the peak amplifier, such that an output impedance at an output node of the voltage combiner is a high impedance if the input signal is below the threshold level.

Another aspect of the invention relates to another system for amplifying an input signal. The system can comprise a main amplifier to amplify a delayed version of the input signal and a peak amplifier to amplify the input signal upon the input signal reaching a threshold level and disable amplification upon the input signal falling below the threshold level. The system can also comprise a coaxial cable to electromagnetically couple the output of the main amplifier and the peak amplifier.

Yet another aspect of the invention relates to a system for amplifying an input signal. The system can comprise a main amplifier to amplify a delayed version of the input signal and a peak amplifier to amplify the input signal upon the input signal reaching about one quarter of a peak level of the input signal and disable amplification upon the input signal falling below about one quarter of the peak level. The system can also comprise a voltage combiner to electromagnetically couple the output of the main amplifier and the peak amplifier, such that an output impedance at an output node of the voltage combiner is a high impedance if the input signal is below the threshold level.

DETAILED DESCRIPTION

An amplifying system can include a peak amplifier and a main amplifier. Additionally, a voltage summer can be employed to combine output voltages from the peak amplifier and the main amplifier in a voltage summing configuration. In some examples, the voltage summer could be implemented as an electromagnetic coupling transformer, such as a coaxial cable. The voltage summer can operate, for example, as a quarter wave impedance inverter. Employment of such a voltage summer allows the amplifying system to provide a relatively high gain with a relatively large bandwidth.

Figure 1:
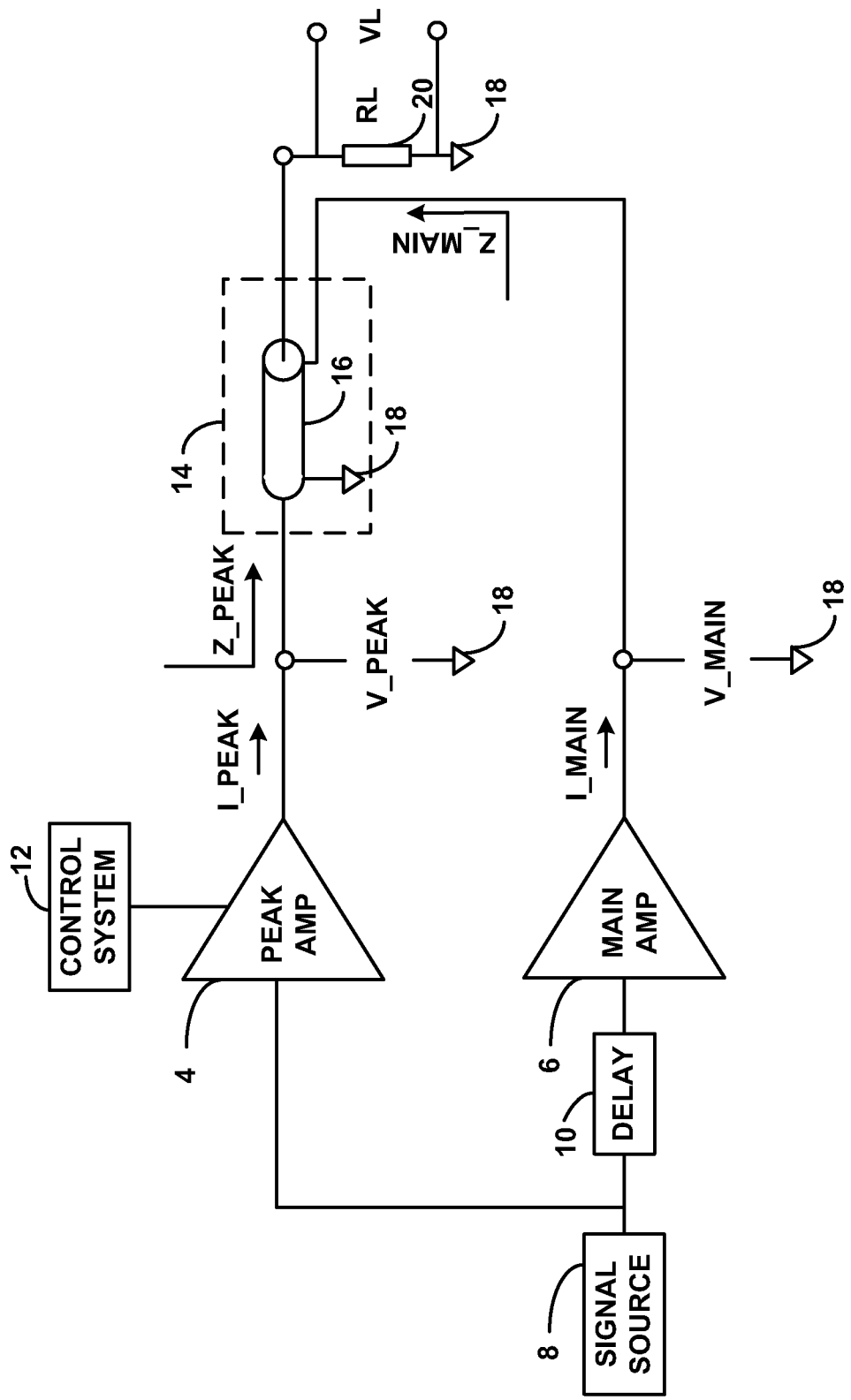
FIG. 1 illustrates an example of an amplifying system.

FIG. 1 illustrates an example of an amplifying system 2. The amplifying system 2 can be employed in environments of application wherein a relatively large bandwidth is needed. Such environments include radio frequency (RF) broadcasting, point-to-point RF communications, etc. The amplifying system 2 can include a peak amplifier 4 and a main amplifier 6 connected in parallel. The peak amplifier 4 and the main amplifier 6 can amplify a signal from a signal source 8, which signal can be referred to as an input signal. The peak amplifier 4 can be implemented as a nonlinear amplifier, such as a class C amplifier. The main amplifier 6 can be implemented as a linear amplifier, such as class A amplifier. It is to be understood that other configurations, the peak amplifier 4 and/or the main amplifier 6 could be implemented as other classes of amplifier. In some examples, the peak amplifier 4 and the main amplifier 6 can be configured to include metal oxide semiconductor field effect transistors (MOSFETs). Moreover, the peak amplifier 4 and the main amplifier 6 can be configured to provide the same (or similar) gains or different gains, depending on the environment of application.

The main amplifier 6 can be configured to conduct (e.g., amplify) continuously, and the peak amplifier 4 can be configured to conduct (e.g., amplify) when a power level of the input signal reaches a threshold level (e.g., about one-quarter to about one half peak power). The peak amplifier 4 can be coupled to the signal source 8 directly, while the main amplifier 6 can be coupled to the signal source 8 via a delay 10 that delays the input signal. Accordingly, the main amplifier 6 can amplify a delayed version of the input signal. The delay 10 can be implemented, for example, as a quarter wave transmission line. The amplifying system 2 can be configured such that when the input signal is below the threshold level, the peak amplifier 4 is disabled by a control system 12, and the main amplifier 6 provides the amplification for the input signal. Upon the input signal reaching or exceeding the threshold level, the peak amplifier 4 can be activated. In some examples, the control system 12 can be implemented as a static network (e.g., a control circuit). In other examples, the control system 12 can be implemented as a processor that can dynamically adjust amplification parameters of the peak amplifier 4. In some examples, the threshold level can be, for example, about quarter to about one half of a peak voltage of the input signal.

The output of the peak amplifier 4 and the main amplifier 6 can be coupled to a voltage summer 14. The voltage summer 14 can electromagnetically combine the output of the main amplifier 6 and the peak amplifier 4 to produce an output signal. The voltage summer 14 can be implemented, for example, as a coaxial cable 16, wherein the output from the peak amplifier 4 is provided to a center conductor of the coaxial cable 16 at a first end, and the output from the main amplifier 6 can be provided to a shielding of the coaxial cable 16 at a second end, distal to the first end. Moreover, the shielding of the coaxial cable 16 can be coupled to an electrically neutral node 18 (e.g., ground) at the first end, while the center conductor can be coupled to an output node at the second end. The output node can be coupled to a load 20. The load 20 can be implemented, for example, as a circuit, such as an RLC circuit. In some examples, the load 20 can be implemented as an antenna. Moreover, the load 20 can also be coupled to the electrically neutral 18 (e.g., ground) node.

In situations where the power is below the threshold level, an impedance observed at an output of the main amplifier 6, $Z_{main}$ (labeled in FIG. 1 as "Z_MAIN"), can be determined from Equation 1.

$$Z_{main}=2(Z_o)-j(Z_o)\cot(x) \quad \text{Equation 1}$$

wherein:
x is the length of the coaxial cable 16, in meters;
$Z_o$ is the system impedance around which the peak and main amplifiers 4 and 6 have been designed; and $$j=\sqrt{-1}.$$

At a center frequency (e.g, about 650 Megahertz (MHz)), and wherein 'x' is equal to about a quarter wave (e.g., λ/4) of a wavelength of the input signal (e.g., about 0.04 meters), $Z_{main}$ is about $2(Z_o)$. Additionally, in this situation, an impedance observed at an output node of the peak amplifier 4, $Z_{peak}$ (labeled in FIG. 1 as "Z_peak") will be a high impedance (e.g., an impedance of ∞). Further, when the input signal is above the threshold level, $Z_{MAIN}$ and $Z_{peak}$ are each equal to about $Z_o$ at the center frequency wherein x is about a quarter wavelength of the input signal.

Further, other operational characteristics of the amplifying system 2 operating at center frequency can be calculated. For instance, a voltage across the load 20, $V_L$ (labeled in FIG. 1 as "VL") can be determined from Equations 2-4.

$$V_{main}=R_L(I_{main})+j(Z_{line})(I_{peak}) \quad \text{Equation 2}$$

$$V_{peak}=j(Z_{line})(I_{main}) \quad \text{Equation 3}$$

$$V_L=R_L(I_{main}) \quad \text{Equation 4}$$

wherein:
$V_{main}$ (labeled in FIG. 1 as "V_MAIN") is the voltage at the output of the main amplifier 6;

$V_{peak}$ (labeled in FIG. 1 as "V_PEAK") is the voltage at the output of the peak amplifier 4;

$I_{main}$ (labeled in FIG. 1 as "I_MAIN") is the current output by the main amplifier 6; and $I_{peak}$ (labeled in FIG. 1 as "I_PEAK") is the current output by the peak amplifier 4.

It is to be noted that below a critical value of $I_{main}$, namely $I_{main\_criticial}$, the peak amplifier 4 does not conduct (e.g., the peak amplifier 4 is disabled). $I_{main}$ can be below $I_{main\_criticial}$, for example, when the power of the input signal is below the threshold level. Moreover, a critical ratio, δ, between a maximum current for the main amplifier 6, $I_{main\_max}$ and $I_{main\_criticial}$ can be determined with Equation 5.

$$\delta = \frac{I_{main\_max}}{I_{main\_critical}} \quad \text{Equation 5}$$

By employing the critical ratio, δ, an Efficient Dynamic Range (EDR) in decibels (dB) for the amplifying system 2 can be determined from Equation 6.

$$EDR=20 \, LOG(\delta) \quad \text{Equation 6}$$

Furthermore, the current at the output of the peak amplifier 4, $I_{peak}$ can be calculated from Equation 7.

$$I_{peak}=j(\delta)(I_{main}-I_{main\_critical}) \quad \text{Equation 7}$$

Equation 7 establishes a relationship between $I_{peak}$ and $I_{main}$ for situations where $I_{main}$ is greater than or equal to $I_{main\_crticial}$, such that both the main amplifier 6 and the peak amplifier 4 are conducting. Moreover, there can be a delay in turning on the peak amplifier 4 when $I_{main}$ passes $I_{main\_crticial}$. As established in Equations 7 and 8, this delay causes the current output at the peak amplifier 4, $I_{peak}$, to grow at a faster pace (e.g., about the critical ratio, 6 times faster) to reach the maximum level, $I_{peak\_max}$ at substantially the same time that the main amplifier 6 reaches $I_{main\_max}$. It is further noted that the current output by the peak amplifier 4, $I_{peak}$ leads in time (+j) over the main current, $I_{main}$, since $I_{main}$ will be delayed by the delay 10 such that voltage at the output of the peak amplifier 4, $V_{peak}$ can be added vectorially in-phase with the voltage at the output of the main amplifier 6, $V_{main}$ via the voltage summer 14.

$$I_{peak\_max}=(\delta-1)(I_{main}-I_{main\_max}) \quad \text{Equation 8}$$

The impedance of the load, $R_L$, in Ohms (Ω) (labeled in FIG. 1 as "RL") can be calculated with Equation 9, and the line impedance, $Z_{line}$ can be calculated from Equation 10.

$$R_L=\delta \cdot Z_o \quad \text{Equation 9}$$

$$Z_{line}=Z_o \cdot \sqrt{(\delta-1)} \quad \text{Equation 10}$$

By employing Equations 1-10, Equations 11 and 12 can be employed to calculate $Z_{peak}$ and $Z_{main}$ at center frequency.

$$Z_{peak} = \begin{cases} \infty & \text{for } I_{main} < I_{main\_critical} \\ Z_o \cdot \sqrt{(\delta-1)} \cdot \frac{I_{main}}{\delta \cdot I_{main} - I_{main\_max}} & \text{for } I_{main} \geq I_{main\_critical} \end{cases} \quad \text{Equation 11}$$

$$Z_{main} = \begin{cases} \delta \cdot Z_o & \text{for } I_{main} < I_{main\_critical} \\ Z_o \cdot \left[ \dfrac{\delta - \sqrt{(\delta-1) \cdot} }{\dfrac{\delta \cdot I_{main} - I_{main\_max}}{I_{main}}} \right] & \text{for } I_{main} \geq I_{main\_critical} \end{cases} \quad \text{Equation 12}$$

By employing the amplifying system 2, a wide bandwidth can be achieved. Moreover, the voltage summer 14 can operate has a quarter-wave impedance inverter that presents a zero (or about zero) impedance across output connections, thereby coupling the main amplifier 6 directly to the load 20 when the peak amplifier 4 is not conducting. Thus, the voltage summer 14 can provide the quarter wave impedance inversion without the need for shorting an output of the voltage summer 14.

Figure 2:
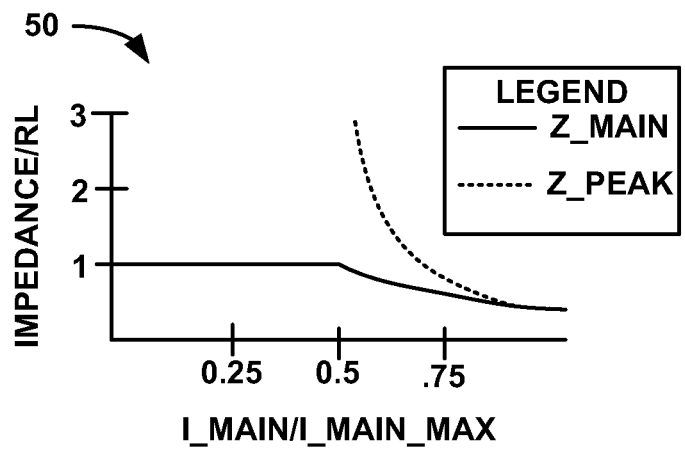
FIG. 2 illustrates an example of a graph depicting an example of an impedance ratio plotted as a function of a current ratio for an amplifying system.

FIG. 2 illustrates an example of performance characteristics of the amplifying system 2 illustrated in FIG. 1. Specifically, FIG. 2 illustrates a graph 50 that plots an impedance ratio as a function of a current ratio. The impedance ratio includes an impedance observed at a main amplifier and a peak amplifier, $Z_{main}$ and $Z_{peak}$, (labeled in FIG. 2 as "Z_MAIN" and "Z_PEAK", respectively) such as the peak and main amplifiers 4 and 6 illustrated in FIG. 1 divided by an impedance of a load, $R_L$ (labeled in FIG. 2 as "RL"). The current ratio includes a current output by the main amplifier, $I_{main}$ (labeled in FIG. 2 as "I_MAIN") divided by a maximum current output by the main amplifier $I_{main\_max}$ (labeled in FIG. 2 as "I_MAIN_MAX"). In the example illustrated in FIG. 2, the critical ratio, δ can be set to about 2, which can lead to an EDR of about 6 dB.

Figure 3:
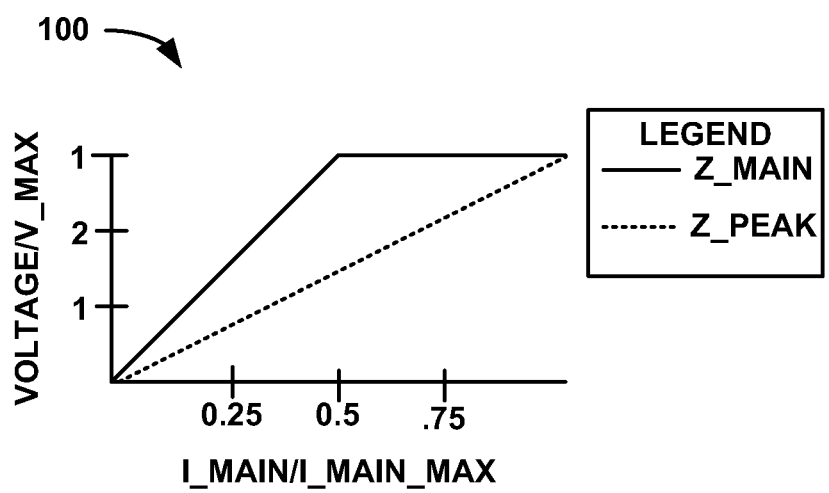
FIG. 3 illustrates an example of a graph depicting an example of a voltage ratio plotted as a function of a current ratio for an amplifying system.

FIG. 3 illustrates another example of performance characteristics of the amplifying system 2 illustrated in FIG. 1. Specifically, FIG. 3 illustrates a graph 100 that plots a voltage ratio as a function of a current ratio. The voltage ratio can include a voltage observed at a main amplifier and a peak amplifier, $V_{main}$ and $V_{peak}$, (labeled in FIG. 3 as "V_MAIN" and "V_PEAK", respectively), such as the peak and main amplifiers 4 and 6 illustrated in FIG. 1 divided by a maximum voltage for each of the main amplifier and peak amplifier. The current ratio can include a current output by the main amplifier, $I_{main}$ (labeled in FIG. 3 as "I_MAIN") divided by a maximum current output by the main amplifier $I_{main\_max}$ (labeled in FIG. 3 as "I_MAIN_MAX"). In the example illustrated in FIG. 3, the critical ratio, δ can be set to about 2, which can lead to an EDR of about 6 dB.

Figure 4:
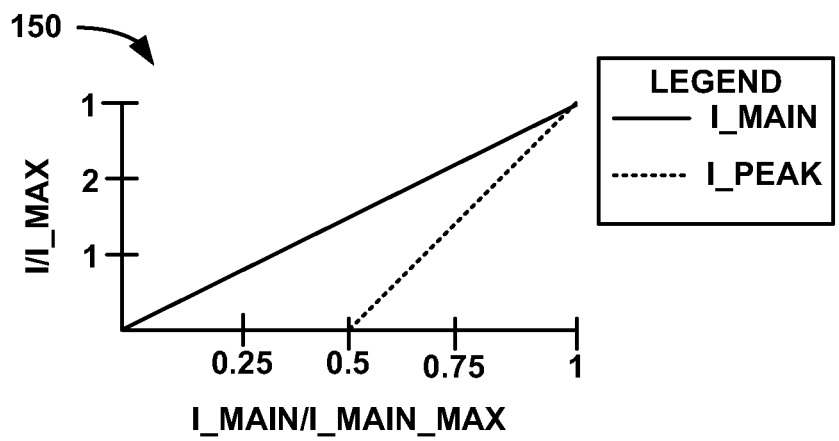
FIG. 4 illustrates an example of a graph depicting an example of a first current ratio plotted as a function of a second current ratio for an amplifying system.

FIG. 4 illustrates yet another example of performance characteristics of the amplifying system 2 illustrated in FIG. 1. Specifically, FIG. 4 illustrates a graph 150 that plots a first current ratio as a function of a second current ratio. The first current ratio can include current output at a main amplifier and a peak amplifier, $I_{main}$ and $I_{peak}$, (labeled in FIG. 4 as "I_MAIN" and "I_PEAK", respectively), such as the peak and main amplifiers 4 and 6 illustrated in FIG. 1 divided by a maximum current for each of the main amplifier and the peak amplifier. The second current ratio can include current output by the main amplifier, $I_{main}$ (labeled in FIG. 4 as "I_MAIN") divided by a maximum current output by the main amplifier $I_{main\_max}$ (labeled in FIG. 4 as "I_MAIN_MAX"). In the example illustrated in FIG. 4, the critical ratio, δ can be set to about 2, which can lead to an EDR of about 6 dB.

Figure 5:
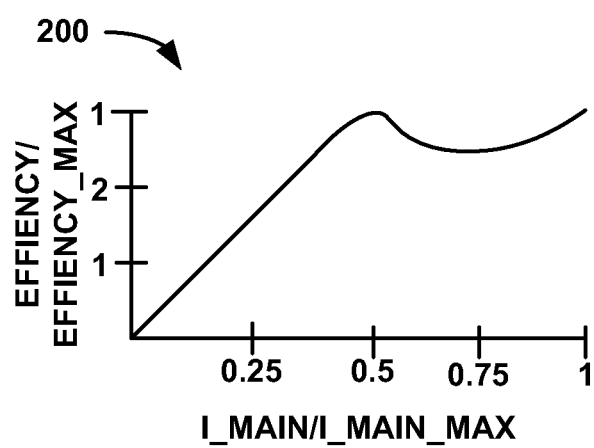
FIG. 5 illustrates an example of a graph depicting an example of an efficiency ratio plotted as a function of a current ratio for an amplifying system.

FIG. 5 illustrates still another example of performance characteristics of the amplifying system 2 illustrated in FIG. 1. Specifically, FIG. 5 illustrates a graph 200 that plots an efficiency ratio as a function of a current ratio. The efficiency ratio can include an efficiency of an amplifying system divided by a maximum efficiency of the amplifying system. The current ratio can include a current output by the main amplifier, $I_{main}$ (labeled in FIG. 5 as "I_MAIN") and a maximum current output by the main amplifier $I_{main\_max}$ (labeled in FIG. 5 as "I_MAIN_MAX"). In the example illustrated in FIG. 5, the critical ratio, δ can be set to about 2, which can lead to an EDR of about 6 dB.

Figure 6:
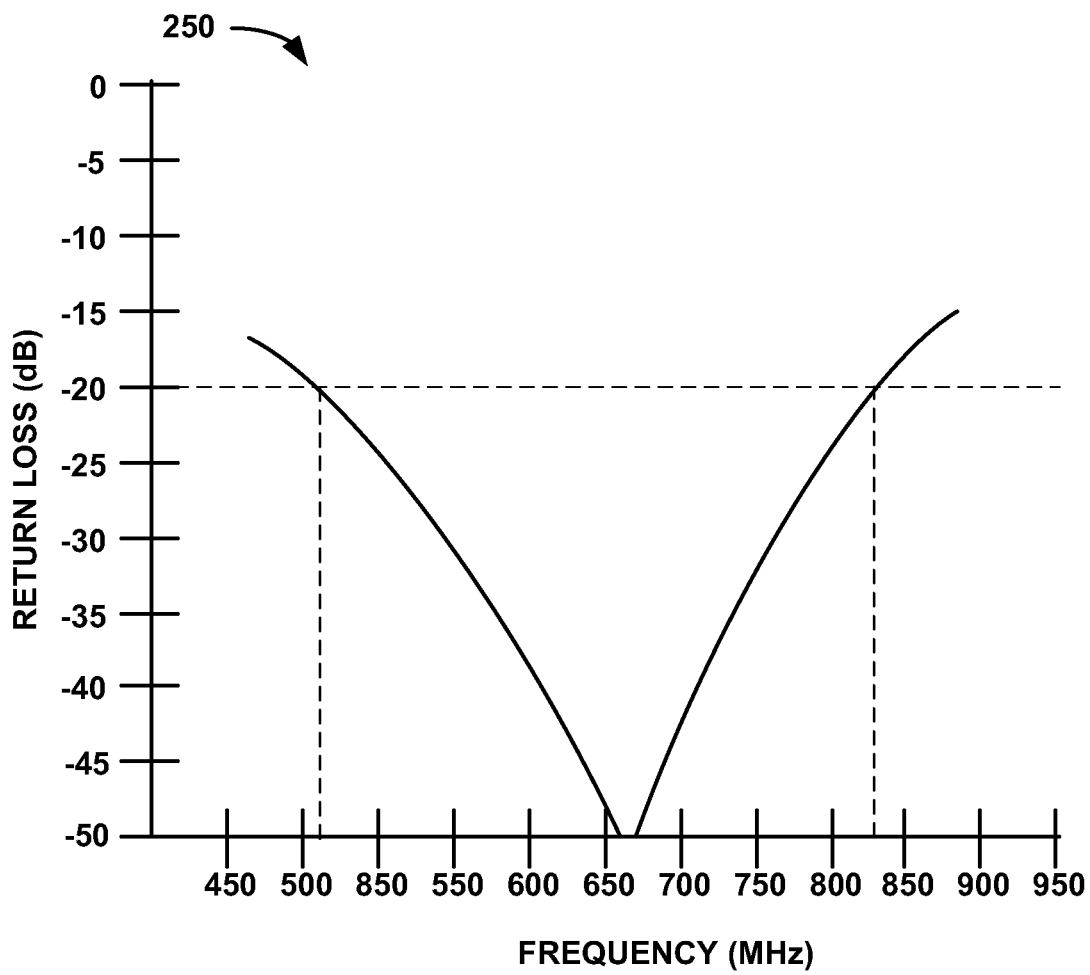
FIG. 6 illustrates an example of a graph depicting an example of a return loss plotted as a function of frequency for an amplifying system.

FIG. 6 illustrates still yet another example of performance characteristics of the amplifying system 2 illustrated in FIG. 1. Specifically, FIG. 6 illustrates a graph 250 that plots a return loss of a main amplifier in an amplifying system, such as the main amplifier 6 of the amplifying system 2 illustrated in FIG. 1 as a function of frequency. The graph can thus represent a bandwidth performance of the amplifying system. In the example illustrated in FIG. 6, the critical ratio, δ can be set to about 2, which can lead to an EDR of about 6 dB. As is illustrated in FIG. 6, the return loss is below −20 dB from about 510 MHz to about 825 MHz. Accordingly, the amplifying system can provide a relatively high efficiency over a relatively large bandwidth (e.g., about 315 MHz).

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims.

What is claimed is:

1. A system for amplifying an input signal comprising:
 a main amplifier to amplify a delayed version of the input signal;
 a peak amplifier to amplify the input signal upon the input signal reaching a threshold level and disable amplification upon the input signal falling below the threshold level; and
 a voltage combiner to electromagnetically couple the output of the main amplifier and the peak amplifier, such that an impedance between nodes at a given end of the voltage combiner is about zero if the input signal is below the threshold level, and wherein an output of the peak amplifier is applied to another end of the voltage combiner and an output of the main amplifier is applied to a node at the given end of the voltage combiner.

2. The system of claim 1, wherein the voltage combiner comprises a coaxial cable.

3. The system of claim 2, wherein the voltage combiner comprises a quarter wave impedance inverter.

4. The system of claim 2, wherein the output node of the peak amplifier is coupled to a center conductor of the coaxial cable at the another end of the coaxial cable, the another end being distal to the given end of the coaxial cable.

5. The system of claim 4, wherein a shielding of the coaxial cable is coupled to an electrically neutral node at the another end of the coaxial cable.

6. The system of claim 5, wherein an output node of the main amplifier is coupled to the shielding of the coaxial cable at the given end of the coaxial cable.

7. The system of claim 6, wherein the center conductor at the another end of the coaxial cable comprises an output node of the voltage combiner.

8. The system of claim 1, wherein the amplifying system provides a return loss for the main amplifier below about −20 dB for a bandwidth of at least about 315 MHz.

9. The system of claim 1, wherein the amplifying system provides a high impedance at the output node of the peak amplifier if the input signal is below the threshold level.

10. The system of claim 2, wherein the coaxial cable has a length of about one quarter wavelength of the input signal.

11. The system of claim 1, wherein the voltage combiner provides quarter wave impedance inversion in the absence of a short at an output of the voltage combiner.

12. The system of claim 1, wherein:

$$Z_{peak} = Z_o \cdot \sqrt{(\delta - 1)} \cdot \frac{I_{main}}{\delta \cdot I_{main} - I_{main\_max}}$$

for $I_{main} \geq I_{main\_critical}$ wherein:
   $Z_{peak}$ comprises an impedance observed in an output of the peak amplifier;
   $Z_o$ comprises the amplifying system impedance;
   $I_{main}$ comprises a current output by the main amplifier;
   $I_{main\_critical}$ comprises a current output by the main amplifier when the input signal is at the threshold level;
   $I_{main\_max}$ comprises a maximum current output by the main amplifier; and $$\delta = \frac{I_{main\_max}}{I_{main\_critical}}.$$

13. The system of claim 1, wherein:

$$Z_{main} = \begin{cases} \delta \cdot Z_o & \text{for } I_{main} < I_{main\_critical} \\ Z_o \cdot \left[ \frac{\delta - \sqrt{(\delta-1)} \cdot \frac{\delta \cdot I_{main} - I_{main\_max}}{I_{main}}}{} \right] & \text{for } I_{main} \geq I_{main\_critical} \end{cases}$$

wherein:
   $Z_{main}$ comprises an impedance observed at an output of the main amplifier;
   $Z_o$ comprises the amplifying system impedance;
   $I_{main}$ comprises a current output by the main amplifier;
   $I_{main\_critical}$ comprises a current output by the main amplifier when the input signal is at the threshold level;
   $I_{main\_max}$ comprises a maximum current output by the main amplifier; and $$\delta = \frac{I_{main\_max}}{I_{main\_critical}}.$$

14. A system for amplifying an input signal comprising:
   a main amplifier to amplify a delayed version of the input signal;
   a peak amplifier to amplify the input signal upon the input signal reaching a threshold level and disable amplification upon the input signal falling below the threshold level; and
   a coaxial cable to electromagnetically couple the output of the main amplifier and the peak amplifier, and wherein an output of the peak amplifier is applied to a given end of the coaxial cable and an output of the main amplifier is applied to another end of the coaxial cable.

15. The system of claim 14, wherein the coaxial cable provides a quarter wave impedance inversion for the input signal.

16. The system of claim 15, wherein the amplifying system provides a return loss for the main amplifier below about −20 dB for a bandwidth of at least about 315 MHz.

17. The system of claim 14, wherein the peak amplifier comprises a nonlinear amplifier and the main amplifier comprises a linear amplifier.

18. A system for amplifying an input signal comprising:
   a main amplifier to amplify a delayed version of the input signal;
   a peak amplifier to amplify the input signal upon the input signal reaching about one quarter of a peak level of the input signal and disable amplification upon the input signal falling below about one quarter of the peak level; and
   a voltage combiner to electromagnetically couple the output of the main amplifier and the peak amplifier, such that an impedance between nodes at a given end the voltage combiner is about zero if the input signal is below the threshold level, and wherein an output of the peak amplifier is applied to another end of the voltage combiner and an output of the main amplifier is applied to a node at the given end of the voltage combiner.

19. The system of claim 18, wherein the voltage combiner comprises a coaxial cable.

20. The system of claim 19, wherein the coaxial cable provides a quarter wave impedance inversion for the input signal.

* * * * *